United States Patent
Shenoy

(10) Patent No.: US 6,573,560 B2
(45) Date of Patent: Jun. 3, 2003

(54) TRENCH MOSFET WITH REDUCED MILLER CAPACITANCE

(75) Inventor: Praveen Muraleedharan Shenoy, Wilkes Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/993,145

(22) Filed: Nov. 6, 2001

(65) Prior Publication Data

US 2003/0085431 A1 May 8, 2003

(51) Int. Cl.[7] .............................................. H01L 29/76
(52) U.S. Cl. ........................ 257/330; 257/331; 257/341; 257/394; 257/401; 438/259
(58) Field of Search ................................ 257/330, 394, 257/326, 900, 335, 329, 401, 341, 331; 438/259, 637

(56) References Cited

U.S. PATENT DOCUMENTS 6,312,993 B1 * 11/2001 Hshieh et al. .............. 438/270

* cited by examiner

Primary Examiner—Sara Crane
Assistant Examiner—Junghwa M. Im
(74) Attorney, Agent, or Firm—Thomas R. FitzGerald, Esq.

(57) ABSTRACT

A trench MOS-gated device having an upper surface includes a substrate having an upper layer of doped monocrystalline semiconductor material of a first conduction type. A gate trench in the upper layer has sidewalls and a floor lined with a first dielectric material and a centrally disposed core that is formed of a second dielectric material and extends upwardly from the first dielectric material on the trench floor to contact an interlevel dielectric layer overlying the gate trench. The remainder of the trench is substantially filled with a conductive material that encompasses and contacts the core of second dielectric material. A doped well region of a second conduction type overlies a drain zone of the first conduction type in the upper layer, and a heavily doped source region of the first conduction type contiguous to the gate trench and a heavily doped body region of the second conduction type are disposed in the well region at the upper surface. The interlevel dielectric layer disposed on the upper surface overlies the gate trench and the source region, and a metal layer in electrical contact with the source and body regions overlies the upper surface and interlevel dielectric layer.

11 Claims, 4 Drawing Sheets

TRENCH MOSFET WITH REDUCED MILLER CAPACITANCE

CROSS-REFERENCE TO RELATED APPLICATION

This application is related to co-pending, commonly assigned application Ser. No. 09/992,629, filed Nov. 6, 2001 by Hao et al. for TREWNCH MOSFET WITH LOW GATE CHARGE.

FIELD OF THE INVENTION

The present invention is directed to semiconductor devices and, more particularly, to a trench MOSFET with reduced Miller capacitance having improved switching speed characteristics.

BACKGROUND OF THE INVENTION

In a typical trench MOSFET, such as that schematically depicted in FIG. 1, gate-to-drain capacitance varies with gate and drain voltage, having a high value during the on-state. As the drain voltage increases, the gate-to-drain capacitance decreases. Amplification of gate-to-drain capacitance by feedback, referred to as Miller capacitance, can result in severe switching loss and a marked reduction in the frequency response FIG. 2 is a plot of gate charge, $Q_g$, versus gate-source voltage, $V_{gs}$. The horizontal portion, which illustrates the effect of Miller capacitance, occurs at the turn-on voltage, where the rapidly falling drain forces the gate driver to supply additional charge to the gate-to-drain capacitance. Reducing or eliminating Miller capacitance, as provided by the present invention, would result in improved switching characteristics of the MOSFET.

SUMMARY OF THE INVENTION

The present invention is directed to a trench MOS-gated device having an upper surface and comprising a substrate that includes an upper layer comprising doped monocrystalline semiconductor material of a first conduction type. A gate trench in the upper layer has sidewalls and a floor lined with a first dielectric material and a centrally disposed core that comprises a second dielectric material and extends upwardly from the first dielectric material on the trench floor to contact an interlevel dielectric layer disposed on the upper surface and overlying the gate trench. The remainder of the trench is substantially filled with a conductive material that encompasses and contacts the core of second dielectric material.

A doped well region of a second conduction type overlies a drain zone of the first conduction type in the upper layer, and a heavily doped source region of the first conduction type contiguous to the gate trench and a heavily doped body region of the second conduction type are disposed in the well region at the upper surface of the device. The interlevel dielectric layer disposed on the upper surface overlies the gate trench and the source region, and a metal layer in electrical contact with the source and body regions overlies the upper surface and the interlevel dielectric layer.

DETAILED DESCRIPTION OF THE INVENTION

Figure 1:
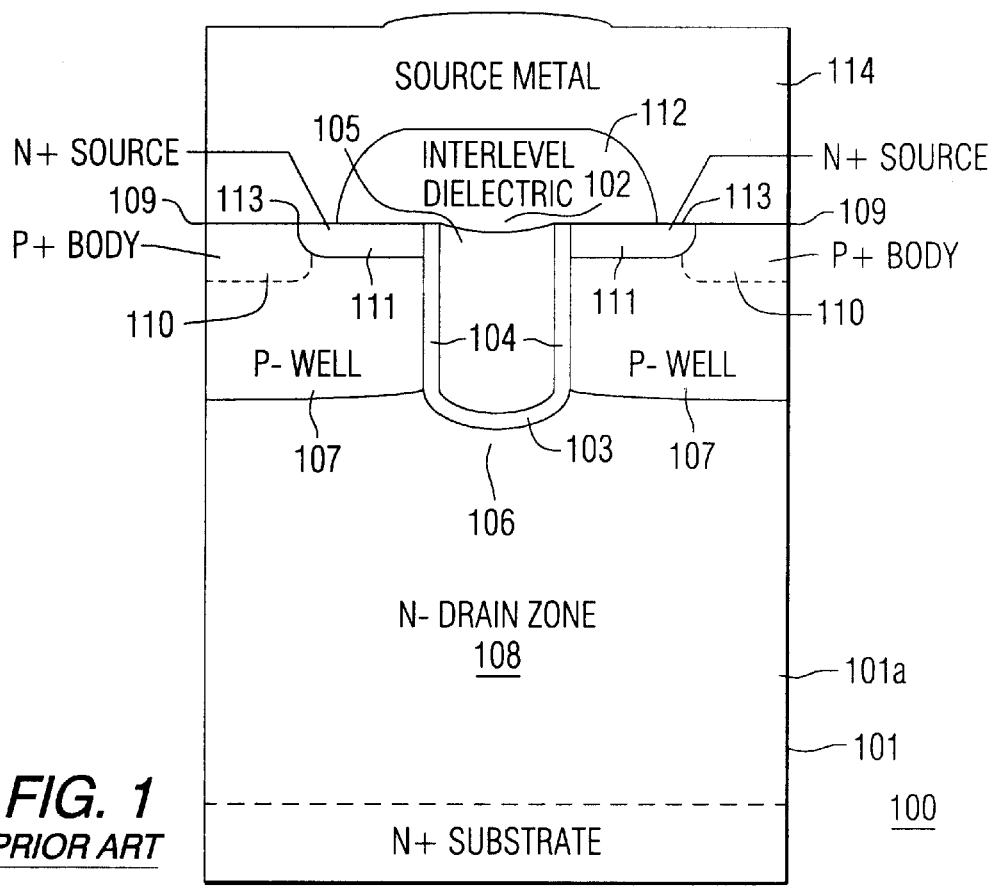
FIG. 1 is a schematic illustration of a conventional prior art trench MOSFET.
Figure 2:
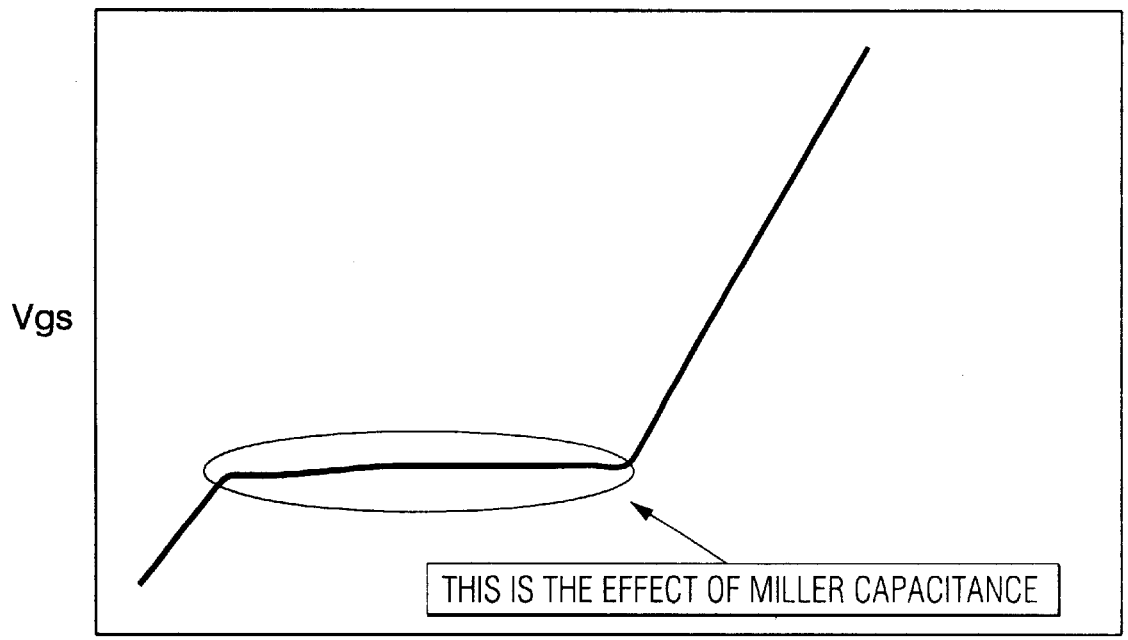
FIG. 2 is a plot of gate charge, $Q_g$, versus gate-source voltage, $V_{gs}$, illustrating the effect of Miller capacitance

FIG. 1 schematically depicts the cross-section of a trench-gated N-type MOSFET device 100 of the prior art formed on an upper layer 101a of an N+ substrate 101. Device 100 includes a trench 102 whose sidewalls 104 and floor 103 are lined with a gate dielectric material such as silicon dioxide. Trench 102 is filled with a conductive material 105 such as doped polysilicon, which serves as an electrode for gate region 106.

Upper layer 101a of substrate 101 further includes P-well regions 107 overlying an N-drain zone 108. Disposed within P-well regions 107 at an upper surface 109 of upper layer 101a are heavily doped P+ body regions 110 and heavily doped N+ source regions 111. An interlevel dielectric layer 112, preferably formed from borophosphosilicate glass (BPSG), overlies gate region 106 and source regions 111. Contact openings 113 enable metal layer 114 to contact body regions 110 and source regions 111.

Figure 3:
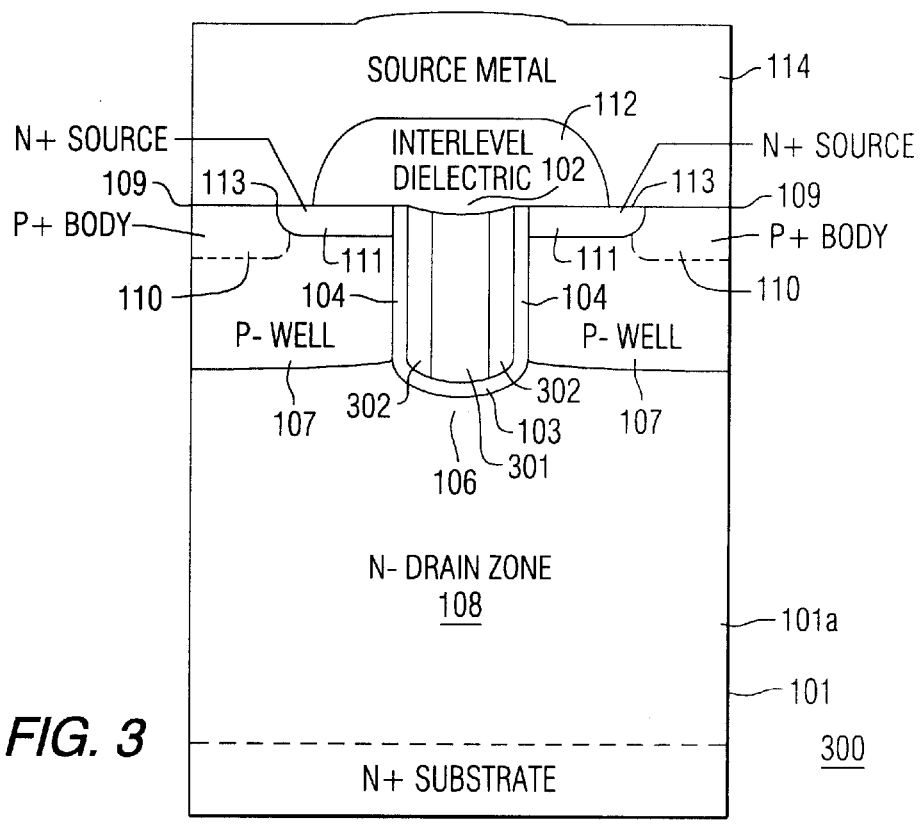
FIGS. 3 and 4 are schematic illustrations of two embodiments of a trench MOSFET device of the present invention.
Figure 4:
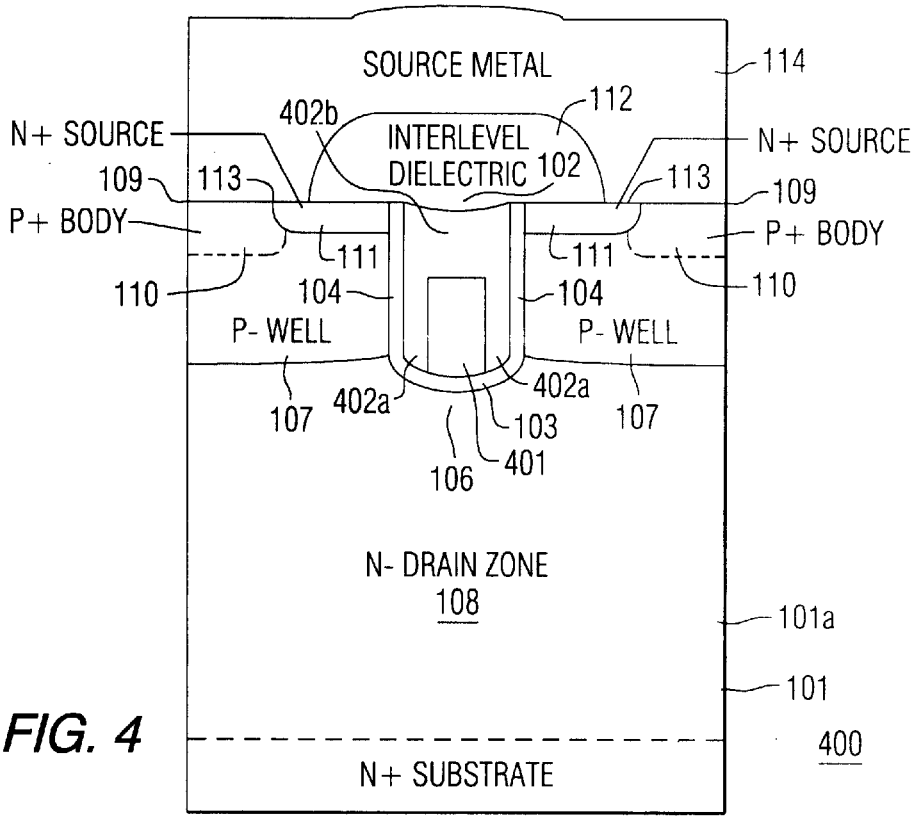

In FIGS. 3 and 4 are schematically illustrated two embodiments of the present invention, trench MOSFET devices 300 and 400, respectively. In addition to the features common to prior art device 100, trench MOSFET device 300 includes a centrally disposed core 301 that comprises a second dielectric material and extends upwardly from the first dielectric material on the trench floor 103 to contact interlevel dielectric layer 112. The remainder of trench 102 is substantially filled with a conductive material 302 that encompasses core 301, which can be formed from spin on glass (SOG), a polyimide, or, preferably, borophosphosilicate glass (BPSG).

Trench MOSFET device 400 also includes a centrally disposed core 401 of second dielectric material in trench 102. In contrast to device 300, dielectric core 401 does not extends upwardly to contact interlevel dielectric layer 112. Instead, the conductive material that encompasses core 401 includes a thin portion 402a that is in contact with trench sidewalls 104 and a portion of floor 103 and a thicker portion 402b that separates core 401 from interlevel dielectric layer 112. The additional conductive material in trench 102 of device 400 serves to beneficially lower the resistance of the conductive material.

The device of the present invention can be fabricated using various procedures known in the art. Device 300 can be constructed by, for example, masking substrate 101 containing well region 107 to define trench 102, implanting and diffusing an N-type dopant to form N+ source regions 111, etching trench 102, depositing gate oxide on floor 103 and sidewalls 104, depositing a thin layer, 0.1–0.2 μm, for example, of polysilicon then doping it and etching it to form conductive material 302, planarizing trench 102 with second dielectric material to form dielectric core 301, depositing interlevel dielectric layer 112, forming contact openings 113, and depositing and patterning metal layer 114.

Figure 5:
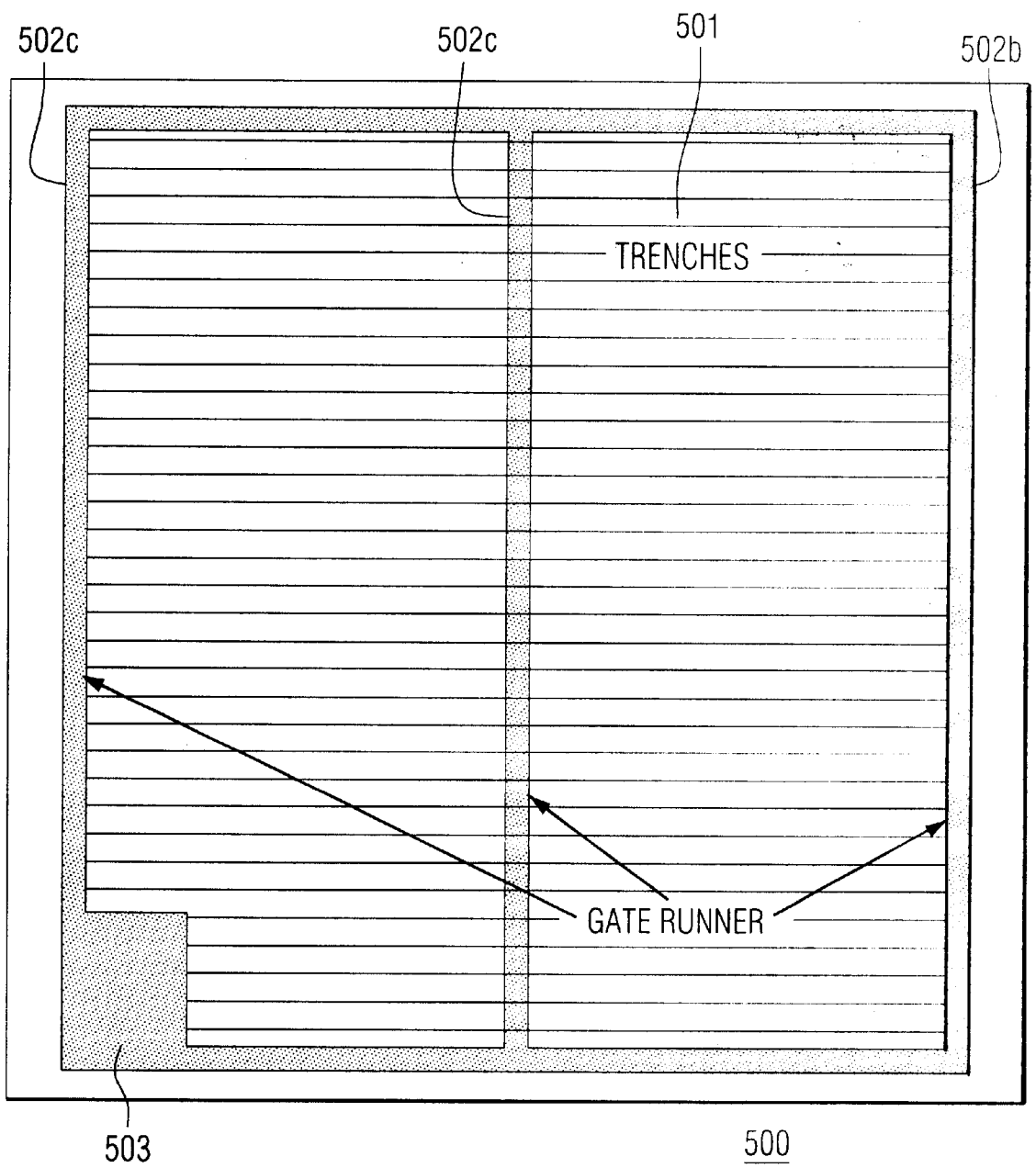
FIG. 5 illustrates the use of gate runners in a device of the present invention

The relatively thin layer of conductive material 302 encompassing dielectric core 301 in device 300 can result in increased resistance relative to that of prior art device 100. This can be mitigated by the use of additional conductive gate runners, as shown in FIG. 5, which depicts a die 500 that comprises a plurality of gate trenches 501, conductive gate runners 502a and 502b comprising doped polysilicon, for example, and gate pad 503. For a given thickness of conductive material 302, the addition of a conductive gate runner 502c orthogonally across trenches 501 reduces the resistance by one-half.

The trench MOS-gated device of the present invention reduces the gate-to-drain capacitance by reducing the area of overlap between the gate electrode and the drift region. As a result of this decreased overlap, the new device is expected to have lower gate-drain capacitance ($C_{gd}$) and therefore lower gate charge ($Q_g$). Furthermore, the forward conduction is not expected to be degraded.

To verify the advantage of the new device, two-dimensional numerical simulations of trench MOSFETs with voltage ratings of 30 V and 600 V were carried out and compared with those of conventional trench MOSFETs with identical parameters, namely: a trench depth of 2 $\mu$m, trench width of 3 $\mu$m, mesa width of 7 $\mu$m, gate oxide thickness of 0.1 $\mu$m, gate poly thickness in the new device of 0.25 $\mu$m, and dielectric constant of a core SOG dielectric layer of 7.5. The results are tabulated below:

| | 30 V MOSFET | | 600 V MOSFET | |
|---|---|---|---|---|
| Parameter | Comparison | Invention | Comparison | Invention |
| $R_{dson}$ (m$\Omega$ – cm$^2$) | 0.465 | 0.466 | 149 | 149 |
| $t_{plateau}$ (nsec) | 15 | 11 | 13 | 10 |
| $E_{on}$ ($\mu$J)* | 4.85 | 5.47 | 3.86 | 4.02 |

Figure 6:
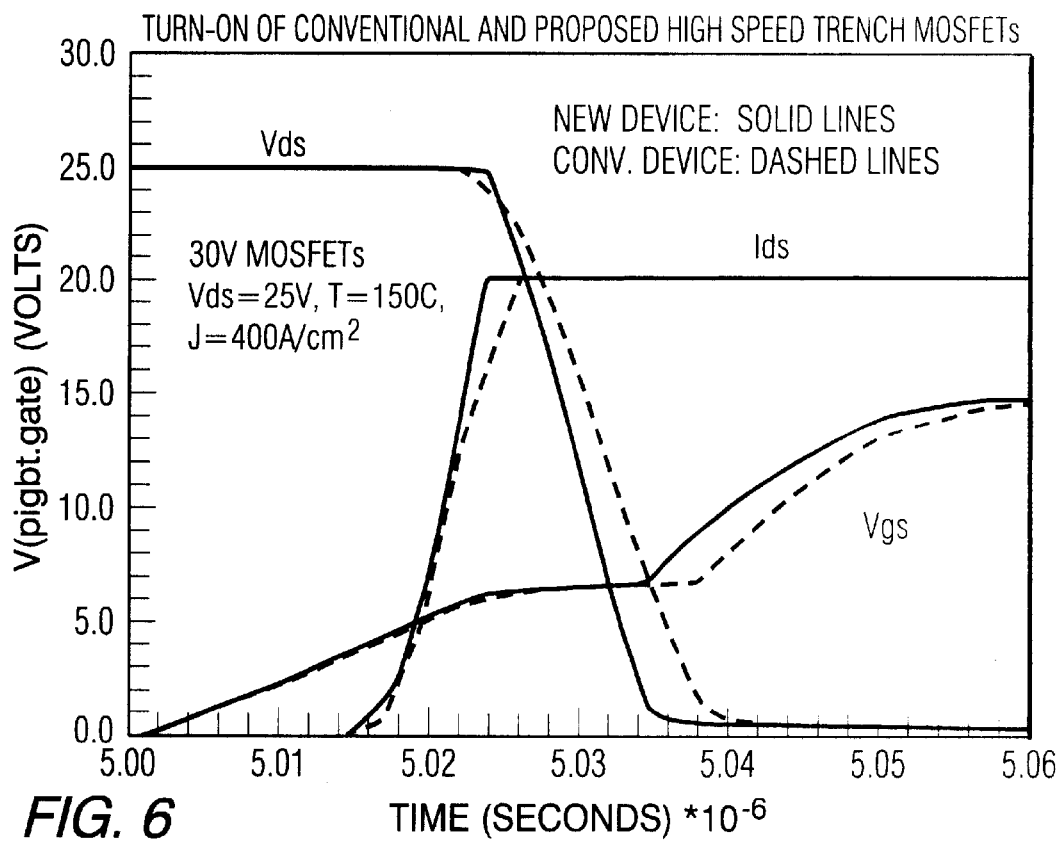
FIGS. 6 and 7 are waveform plots comparing switching speeds for simulations of conventional devices and devices of the present invention.
Figure 7:
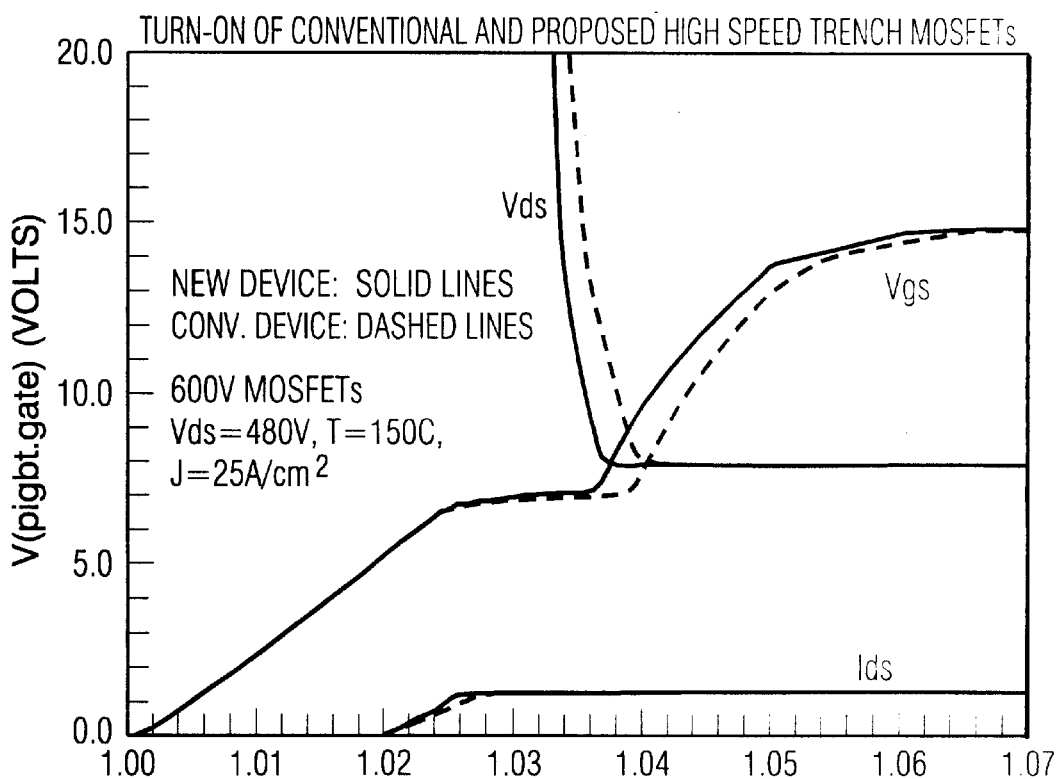

*$E_{on}$ is measured at 25 A/cm$^2$ for 600 V MOSFETs and at 400 A/cm$^2$ 30 V MOSFETs From the entries in the table above, it can be concluded that $R_{dson}$ values remain the same for both the conventional and new devices even as the gate voltage plateau times for the latter are significantly reduced. The device of the present invention also has faster current rise time and voltage fall time. This effect is more pronounced with the low voltage MOSFETs because of higher drift region doping, and therefore greater $C_{gd}$ reduction. The switching waveforms of the 30 V and 600 V MOSFETs, shown in FIGS. 6 and 7, respectively, clearly demonstrate that the devices of the invention are faster and have lower gate charge than the comparison devices. This improvement is obtained even with devices have the relatively narrow trench width of 3 $\mu$m. For wider trench devices, the improvement would be even greater.

Although the advantage of the present invention has been demonstrated for a MOSFET device, it can, in fact, be applied to any trench device, for example, an insulated gate bipolar transistor or an MOS-controlled thyristor. Furthermore, although the structure of the new device would produce larger improvements in low voltage, wide trench devices, it would be expected to be beneficial for trench devices of any voltage rating or trench width.

The invention has been described in detail for the purpose of illustration, but it is to be understood that such detail is solely for that purpose, and variations can be made therein by those skilled in the art without departing from the spirit and scope of the invention, which is defined by the following claims.

What is claimed:

1. A trench MOS-gated device comprising:

a substrate including an upper layer having an upper surface, said substrate comprising doped monocrystalline semiconductor material of a first conduction type;

a gate trench in said upper layer, said trench having sidewalls and a floor lined with a first dielectric material and a centrally disposed core comprising a second dielectric material and extending upwardly from said first dielectric material on said trench floor to an interlevel dielectric layer disposed on said upper layer and overlying said gate trench, the remainder of said trench being substantially filled with a conductive material that encompasses and contacts said core of second dielectric material;

a doped well region of a second conduction type overlying a drain zone of said first conduction type in said upper layer;

a heavily doped source region of said first conduction type and a heavily doped body region of said second conduction type disposed in said well region at said upper surface, said source region being contiguous to said gate trench, said interlevel dielectric layer overlying said source region and said gate trench; and a metal layer overlying said upper surface and said interlevel dielectric layer, said metal layer being in electrical contact with said source and body regions.

2. The device of claim 1 wherein said core of second dielectric material extends upwardly to contact said interlevel dielectric layer.

3. The device of claim 1 wherein said upper layer is included in said substrate.

4. The device of claim 1 wherein said upper layer is an epitaxial layer.

5. The device of claim 1 wherein said substrate comprises monocrystalline silicon.

6. The device of claim 1 wherein said first dielectric material comprises silicon dioxide.

7. The device of claim 1 wherein said second dielectric material is spin on glass (SOG), borophosphosilicate glass (BPSG), or a polyimide.

8. The device of claim 1 wherein said core of second dielectric material and said interlevel dielectric layer each comprise borophosphosilicate glass (BPSG).

9. The device of claim 1 wherein said conductive material in said trench comprises doped polysilicon.

10. The device of claim 1 wherein said first conduction type is N and said second conduction type is P.

11. The device of claim 1 is selected from the group consisting of a power MOSFET, an insulated gate bipolar transistor, and an MOS-controlled thyristor.

* * * * *